US012700743B2

(12) United States Patent
Yuan et al.

(10) Patent No.: US 12,700,743 B2
(45) Date of Patent: Aug. 4, 2026

(54) CHARGING APPARATUS

(71) Applicant: Nanjing Chervon Industry Co., Ltd.,
Nanjing (CN)

(72) Inventors: Yuan Yuan, Nanjing (CN); Yafei Cao,
Nanjing (CN); Yuexiang Zhang,
Nanjing (CN)

(73) Assignee: Nanjing Chervon Industry Co., Ltd.,
Nanjing (CN)

( * ) Notice: Subject to any disclaimer, the term of this
patent is extended or adjusted under 35
U.S.C. 154(b) by 644 days.

(21) Appl. No.: 18/347,699

(22) Filed: Jul. 6, 2023

(65) Prior Publication Data

US 2024/0063644 A1     Feb. 22, 2024

(30) Foreign Application Priority Data

| | | | |
|---|---|---|---|
| Aug. 22, 2022 | (CN) | .......................... | 202211004185.4 |
| Aug. 22, 2022 | (CN) | .......................... | 202211004251.8 |
| Aug. 22, 2022 | (CN) | .......................... | 202222210006.4 |
| Aug. 22, 2022 | (CN) | .......................... | 202222211105.4 |
| Aug. 22, 2022 | (CN) | .......................... | 202222212072.5 |

(51) Int. Cl.
| | |
|---|---|
| *H02J 7/70* | (2026.01) |
| *B60L 53/31* | (2019.01) |
| *H02J 7/02* | (2016.01) |
| *H05K 5/00* | (2025.01) |

(52) U.S. Cl.
CPC ..................................... *H02J 7/70* (2026.01);
*H02J 7/02* (2013.01); *H05K 5/0026* (2013.01);
*B60L 53/31* (2019.02); *H02J 2207/20*
(2020.01)

(58) Field of Classification Search
CPC ............ H02J 7/70; H02J 7/02; H02J 2207/20;
H05K 5/0026; B60L 53/31
USPC .......................................................... 320/107
See application file for complete search history.

(56) References Cited

U.S. PATENT DOCUMENTS

| | | | | |
|---|---|---|---|---|
| 6,934,166 | B2 * | 8/2005 | Vinciarelli | .............. H02M 3/28 |
| | | | | 363/17 |
| 9,337,683 | B2 * | 5/2016 | Phillips | ................... B60L 58/15 |
| 9,419,514 | B1 * | 8/2016 | Xiong | ................. H02M 1/4208 |
| 9,595,876 | B2 * | 3/2017 | Nielsen | ............. H02M 3/33546 |
| 10,381,924 | B2 * | 8/2019 | Giuliano | ................ H02M 3/07 |
| 10,498,226 | B2 * | 12/2019 | Li | ..................... H02M 3/33571 |
| 10,967,755 | B2 * | 4/2021 | Phillips | ................... B60L 58/15 |
| 11,217,856 | B2 * | 1/2022 | Varipatis | .................. B25F 5/00 |

(Continued)

FOREIGN PATENT DOCUMENTS

| | | | | |
|---|---|---|---|---|
| CN | 110401365 | A | 12/2020 | |
| CN | 215266945 | U * | 12/2021 | ........... H01R 13/502 |

(Continued)

*Primary Examiner* — M Baye Diao
(74) *Attorney, Agent, or Firm* — Greenberg Traurig, LLP

(57) ABSTRACT

A charging apparatus includes: a housing formed with an accommodating space; and a circuit board assembly disposed in the accommodating space and including at least a printed circuit board provided with multiple electronic elements. The output power of the charging apparatus is greater than or equal to 500 W and less than or equal to 2000 W, and the ratio of the output power of the charging apparatus to the volume of the charging apparatus is higher than or equal to 20 W/in$^3$ and lower than or equal to 30 W/in$^3$. With the preceding solution, the charging apparatus with a small overall volume and high output power can be provided.

20 Claims, 17 Drawing Sheets

(56)  References Cited

U.S. PATENT DOCUMENTS

| | | | |
|---|---|---|---|
| 11,532,978 B2 * | 12/2022 | Liang | H02M 1/007 |
| 11,728,721 B2 * | 8/2023 | Saggini | H02M 1/0093 |
| | | | 323/282 |
| 11,923,515 B2 * | 3/2024 | Fauteux | H01M 10/6555 |
| 11,923,716 B2 * | 3/2024 | Shirazi | H02J 7/02 |
| 2014/0131059 A1 * | 5/2014 | Verbrugge | B25B 21/02 |
| | | | 173/217 |
| 2014/0175869 A1 * | 6/2014 | Phillips | B60L 58/15 |
| | | | 320/160 |
| 2022/0200303 A1 * | 6/2022 | Swamy | H02J 7/50 |

FOREIGN PATENT DOCUMENTS

| | | | | |
|---|---|---|---|---|
| EP | 3505034 A1 * | 7/2019 | | A47L 7/0095 |
| GB | 2615640 A * | 8/2023 | | H02J 7/975 |
| WO | WO-2013019336 A1 * | 2/2013 | | H02J 7/92 |
| WO | 2021050912 A1 | 3/2021 | | |

* cited by examiner

CHARGING APPARATUS

RELATED APPLICATION INFORMATION

This application claims the benefit under 35 U.S.C. § 119(a) of Chinese Patent Application No. 202222211105.4, filed on Aug. 22, 2022, Chinese Patent Application No. 202222210006.4, filed on Aug. 22, 2022, Chinese Patent Application No. 202211004185.4, filed on Aug. 22, 2022, Chinese Patent Application No. 202211004251.8, filed on Aug. 22, 2022, and Chinese Patent Application No. 202222212072.5, filed on Aug. 22, 2022, which applications are incorporated herein by reference in their entirety.

BACKGROUND

A riding lawn mower needs to be equipped with a charging device for charging it. Since a battery pack needed by the riding lawn mower has a relatively large capacity, to increase charging efficiency, a charging device applicable to the riding lawn mower needs to have a relatively strong power output capability. After the power output capability of the charging device is improved, the charging device has an increased volume and a reduced heat dissipation effect.

SUMMARY

In an example, a charging apparatus for charging a power tool or a battery pack adapted to the power tool includes: a housing formed with an accommodating space; and a circuit board assembly disposed in the accommodating space and including at least a printed circuit board provided with multiple electronic elements. The output power of the charging apparatus is greater than or equal to 500 W and less than or equal to 2000 W, and the ratio of the output power of the charging apparatus to the volume of the charging apparatus is higher than or equal to 20 W/in$^3$ and lower than or equal to 30 W/in$^3$.

In some examples, the ratio of the output power of the charging apparatus to the volume of the charging apparatus is higher than or equal to 25 W/in$^3$ and lower than or equal to 30 W/in$^3$.

In some examples, the charging apparatus further includes circuitry including at least a power factor correction (PFC) circuit and an LLC resonant circuit electrically connected to the PFC circuit.

In some examples, the PFC circuit includes an interleaved PFC circuit.

In some examples, the PFC circuit includes a bridgeless PFC circuit.

In some examples, the PFC circuit is configured to receive an alternating current which is externally inputted and convert the alternating current into a first direct current, and the LLC resonant circuit is configured to receive the first direct current outputted by the PFC circuit and convert the first direct current into a second direct current.

In some examples, the PFC circuit includes: a rectifier bridge; a step-up circuit connected to the output terminal of the rectifier bridge and configured to step up a direct current voltage outputted by the rectifier bridge; and an output filter capacitor connected to the output terminal of the step-up circuit.

In some examples, the step-up circuit includes a first group of step-up branches and a second group of step-up branches, where the first group of step-up branches include at least an inductor L1 and a switch transistor Q1 and a switch transistor Q3 which are connected in series with the inductor L1, and the second group of step-up branches include at least an inductor L2 and a switch transistor Q2 and a switch transistor Q4 which are connected in series with the inductor L2.

In some examples, the switch transistor Q1, the switch transistor Q2, the switch transistor Q3, and the switch transistor Q4 are gallium nitride transistors.

In some examples, the circuitry further includes a driver circuit driving and controlling the switch transistor Q1, the switch transistor Q2, the switch transistor Q3, and the switch transistor Q4, and the frequencies of drive signals which are outputted by the driver circuit to control the switch transistor Q1, the switch transistor Q2, the switch transistor Q3, and the switch transistor Q4 to be on and off are higher than or equal to 56 kHz and lower than or equal to 110 kHz.

In some examples, the LLC resonant circuit includes at least an inverter circuit, a resonant circuit, an isolation transformer, and a rectifier and filter circuit which are electrically connected in sequence.

In some examples, the inverter circuit includes at least a switch transistor Q5, a switch transistor Q6, a switch transistor Q7, and a switch transistor Q8, where the switch transistor Q5, the switch transistor Q6, the switch transistor Q7, and the switch transistor Q8 are gallium nitride transistors.

In some examples, the resonant circuit includes a resonant inductor L$_r$, a resonant capacitor C$_r$, and an excitation inductor L$_m$. In some examples, the ratio of excitation inductance L$_m$ to resonant inductance L$_r$ is higher than or equal to 3 and lower than or equal to 10. In some examples, the quality factor Q of the resonant circuit is greater than or equal to 0.1 and less than or equal to 2.

In some examples, the isolation transformer is a planar transformer, where the transformation ratio of the isolation transformer is higher than or equal to 6 and lower than or equal to 12.

In some examples, the output power of the charging apparatus is greater than or equal to 800 W and less than or equal to 1600 W.

A charging apparatus includes: a housing formed with an accommodating space; and a circuit board assembly disposed in the accommodating space and including at least a printed circuit board provided with multiple electronic elements. The charging apparatus further includes circuitry including at least a PFC circuit and an LLC resonant circuit electrically connected to the PFC circuit; and the ratio of the output power of the charging apparatus to the volume of the charging apparatus is higher than or equal to 20 W/in$^3$ and lower than or equal to 30 W/in$^3$.

In some examples, the PFC circuit includes at least an interleaved PFC circuit or a bridgeless PFC circuit. In some examples, the LLC resonant circuit includes at least a full-bridge LLC resonant circuit or a half-bridge LLC resonant circuit.

In some examples, the PFC circuit includes at least a rectifier bridge including at least a switch transistor, and the switch transistor is a gallium nitride transistor.

In some examples, the LLC resonant circuit includes at least an isolation transformer, where the isolation transformer is a planar transformer, and the transformation ratio of the planar transformer is higher than or equal to 6 and lower than or equal to 12.

In some examples, the output power of the charging apparatus is greater than or equal to 500 W and less than or equal to 2000 W.

With the preceding technical solutions, the PFC circuit and the LLC resonant circuit with high voltage conversion efficiency are disposed in the circuitry of the charging apparatus so that the charging apparatus has a high-power output capability and a relatively small volume.

BRIEF DESCRIPTION OF THE DRAWINGS

FIG. 4b is a schematic view of the connection of the lower housing, the printed circuit board, and the first element in FIG. 4a;

FIG. 14 is a circuit topology diagram of an interleaved PFC circuit in the circuitry in FIG. 13a;

FIG. 15 is a circuit topology diagram of a full-bridge LLC resonant circuit in the circuitry in FIG. 13a;

FIG. 16 is a circuit topology diagram of a bridgeless PFC circuit in the circuitry in FIG. 13a; and FIG. 17 is a circuit topology diagram of a half-bridge LLC resonant circuit in the circuitry in FIG. 13a.

DETAILED DESCRIPTION

The present application is described below in detail in conjunction with drawings and examples.

Figure 1:
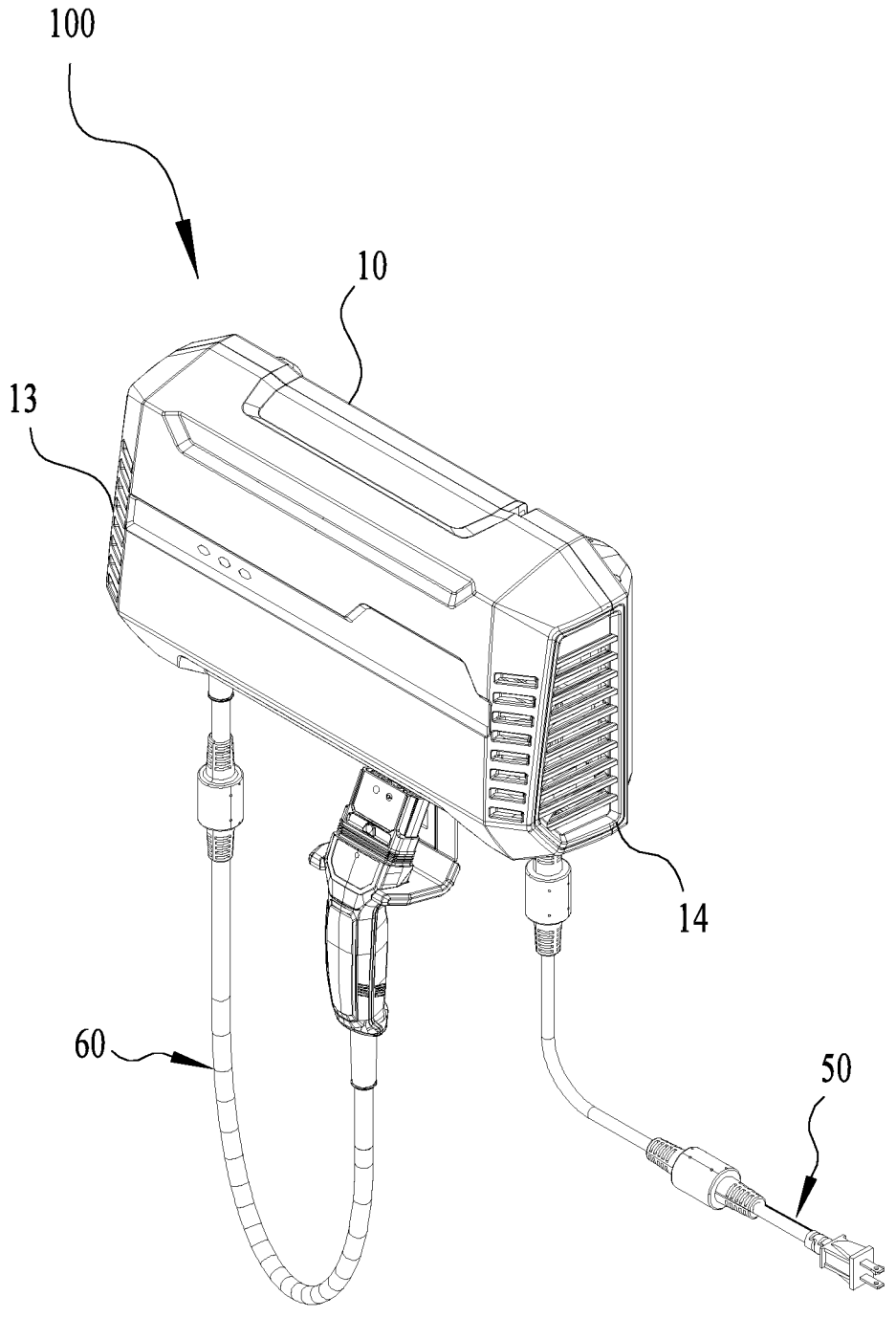
FIG. 1 is a perspective view of a charging apparatus as an example.

FIG. 1 shows a charging apparatus 100 as an example of the present application, and a battery pack can be charged by the charging apparatus 100. The preceding battery pack may power some handheld power tools. These handheld power tools may be electric drills, angle grinders, or the like. The preceding battery pack may also power large power tools, for example, garden tools such as intelligent mowers or snow throwers. The charging apparatus 100 in this example has relatively high output power and is particularly applicable for providing charging functions for battery packs of some large power tools with relatively high output power. The preceding large power tools with the relatively high output power may be riding lawn mowers, the snow throwers, and intelligent walking power tools. In fact, the teachings of the present application are applicable to any type of charging apparatus by which the battery pack is charged. In this example, the battery pack may be mounted to a power tool, a charging input interface is formed on the housing of the power tool and connected to a charging circuit disposed in the power tool, and the charging circuit can transmit electrical energy accessed by the charging input interface to the battery pack mounted to the power tool in this case.

Figure 2:
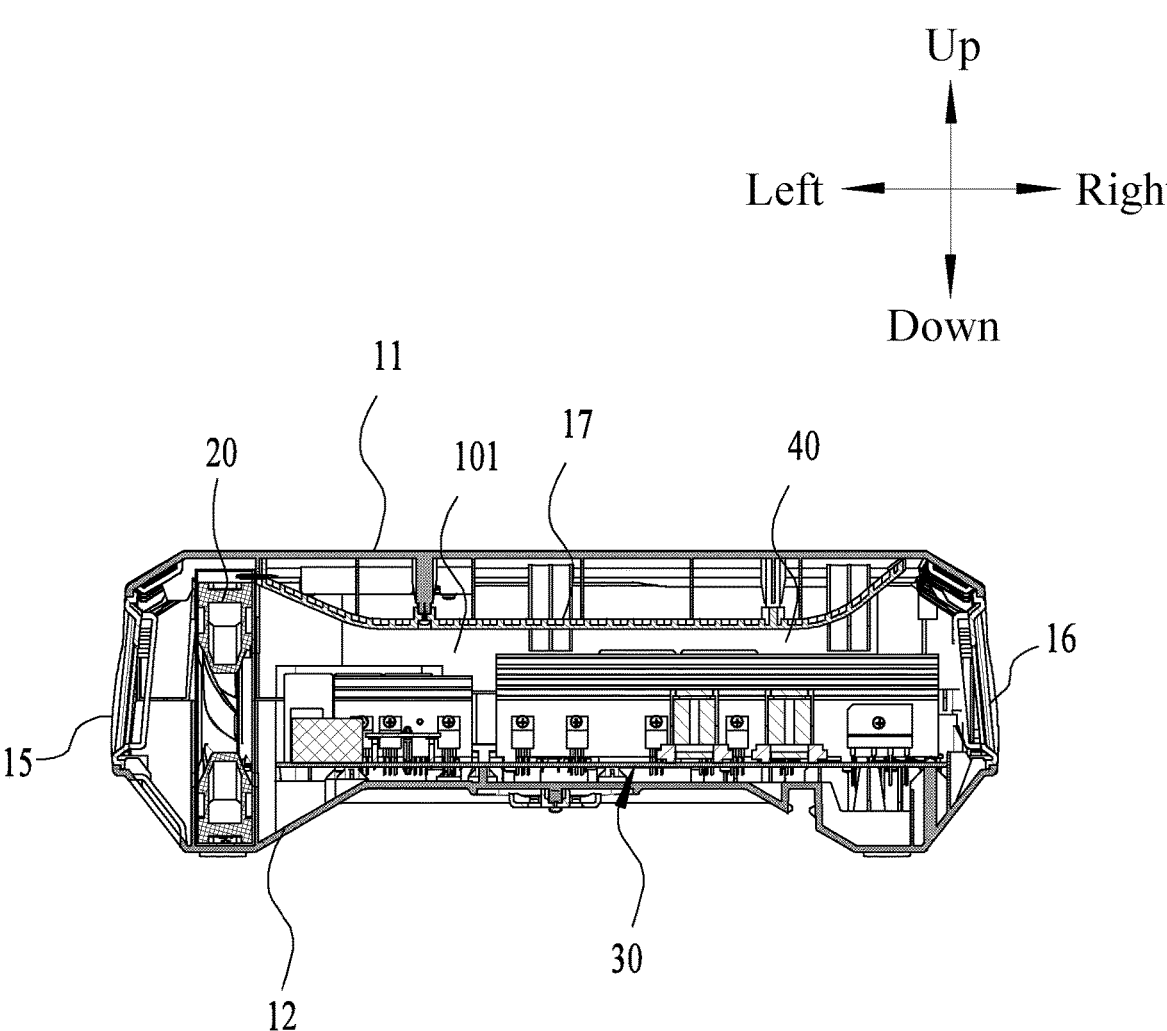
FIG. 2 is a sectional view of the charging apparatus in FIG. 1.
Figure 3:
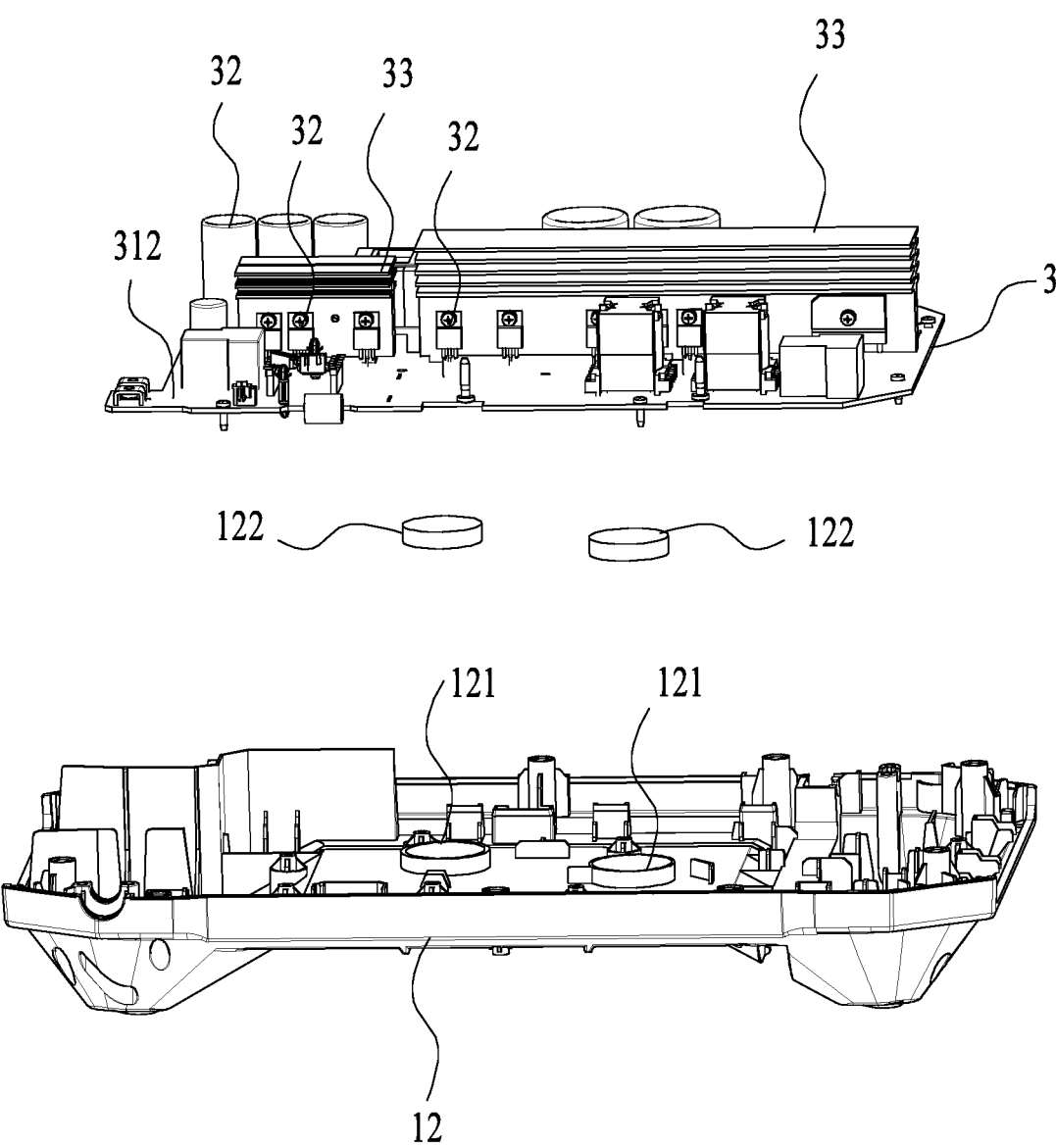
FIG. 3 is an exploded view of the charging apparatus in FIG. 1 with an upper housing removed.

As shown in FIGS. 1 to 3, the charging apparatus 100 includes a housing 10 assembled from an upper housing 11, a lower housing 12, a left housing 13, and a right housing 14. The left housing 13 is provided with an air inlet 15 for an airflow to flow through. The right housing 14 is provided with an air outlet 16 for the airflow to flow through. The airflow can flow into the housing 10 from the air inlet 15 on the housing 10 and flow out of the housing from the air outlet 16 on the housing 10. In some other examples, the housing may be assembled from an upper housing and a lower housing along an up and down direction, which may be understood as that parts of the left housing and the right housing which are originally disposed alone are integrally formed with the upper housing or the lower housing separately. Of course, the housing may be assembled from a left housing and a right housing along a left and right direction, which may be understood as that parts of the upper housing and the lower housing which are originally disposed alone are integrally formed with the left housing or the right housing separately. In addition, it is to be noted that specific components of the housing 10 in the present application cannot limit the present application.

The housing 10 is formed with an accommodating space 101, where a fan 20 for generating a cooling airflow and a circuit board assembly 30 for implementing the charging function of the charging apparatus 100 are disposed in the accommodating space 101. The fan 20 is disposed near the air inlet 15 and used for drawing air outside the housing 10 into the housing 10 via the air inlet 15 to generate the cooling airflow. The circuit board assembly 30 includes a printed circuit board 31 and multiple electronic elements disposed on a second surface 312 of the printed circuit board 31. The preceding electronic elements include at least heat-generating elements 32 and heat dissipation members 33 forming heat-conducting connections to the heat-generating elements 32.

A printed circuit is disposed on the printed circuit board 31 and used for connecting resistors, capacitors, and some semiconductor elements to implement the function of the charging apparatus 100. When energized, the heat-generating elements 32 generate heat. Specifically, the heat generated by the heat-generating elements 32 is greater than or equal to 0.1 kWh. The heat-generating elements 32 are electrically connected to the printed circuit board 31. Multiple heat-generating elements 32 of different types and different specifications may be disposed in the charging apparatus 100. More specifically, the heat-generating elements 32 may be power semiconductor devices or transformers such as field-effect transistors and may be welded onto the printed circuit board 31 through weld legs.

The heat dissipation members 33 are connected to the heat-generating elements 32 in the thermally conductive manner to transfer out the heat generated by the heat-generating elements 32 when energized. In some examples, a heat dissipation member 33 may be implemented in the form of a heat sink which may be a whole plate or multiple separate plates. Referring to FIG. 3, at least part of the heat dissipation member 33 is in contact with surfaces of the multiple heat-generating elements 32, and the heat generated by the multiple heat-generating elements 32 is conducted to the heat dissipation member 33 according to the principle of thermal conduction and then dissipated under the action of the cooling airflow. In general, to enhance the heat dissipation effects of the heat dissipation members 33, surfaces of the heat dissipation members 33 in contact with the multiple heat-generating elements 32 are designed to have plate-shaped structures so that surface contact between the heat dissipation members 33 and the multiple heat-generating elements has the maximum contact area. In addition, one end of the heat dissipation member 33 is configured to be in the shape of a comb so that the heat dissipation member 33 has the maximum heat dissipation area. The heat dissipation members 33 may be disposed in the housing 10 of the charging apparatus 100. Alternatively, of course, the heat dissipation members 33 may be exposed out of the housing 10. It is to be noted that the function of the heat dissipation member 33 in this example is to transfer, with a good heat-conducting property of the heat dissipation member 33, the heat generated by the multiple heat-generating elements 32 to air, the preceding material and shape of the heat dissipation member 33 cannot limit the present application, and those skilled in the art should specifically configure the material and shape of the heat dissipation member 33 according to actual conditions.

The charging apparatus 100 further includes a baffle 17 detachably disposed in the housing 10 and used for guiding the flow direction of the cooling airflow flowing into the housing 10 so that the heat dissipation efficiency of the charging apparatus 100 is improved. Specifically, the baffle 17 is disposed in the accommodating space 101 formed by the housing 10 and detachably connected to the upper housing 11. Referring to FIG. 2, after the baffle 17 is fixedly mounted to the upper housing 11, the baffle 17, the lower housing 12, and part of the upper housing 11 constitute a heat dissipation channel 40 for the cooling airflow to flow through. The baffle 17 in this example can be detachably connected to the upper housing 11 through assembly, and such design has the advantage of facilitating later maintenance such as reducing maintenance costs. On the other hand, the heat dissipation channel can be flexibly adjusted according to heat dissipation requirements so that different heat dissipation requirements are satisfied. Of course, the baffle 17 may be configured to be integrally formed with the housing 10, which is not limited herein. The baffle 17 may be configured to be made of the same material as the housing 10, such as plastics. The baffle 17 may be configured to be made of another material with a good heat-conducting property, and the material of the baffle 17 is not limited in the present application.

Figure 4A:
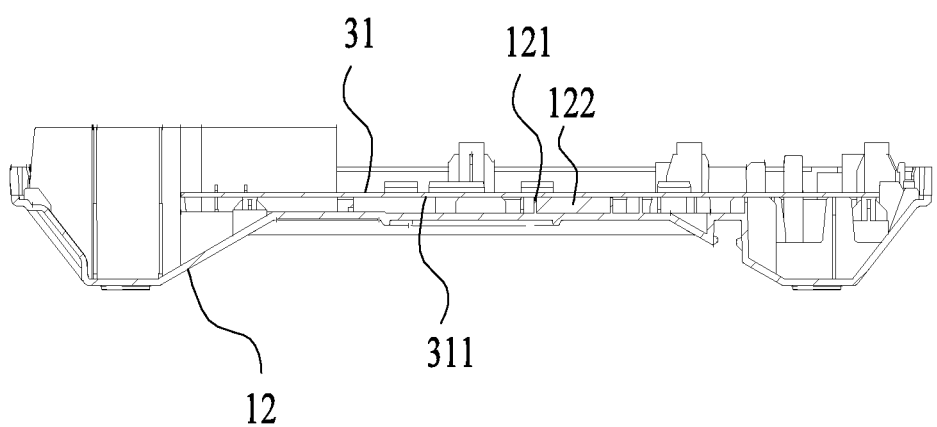
FIG. 4a is a sectional view of a lower housing, a printed circuit board, and a first element.
Figure 4B:
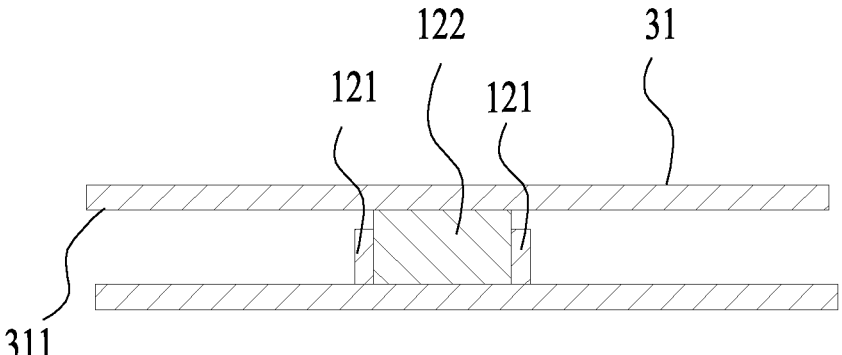

In some examples, referring to FIGS. 3 to 4b, the charging apparatus 100 further includes first elements 122 disposed between the printed circuit board 31 and the lower housing 12. At least part of a first element 122 abuts against a first surface 311 of the printed circuit board 31. When the charging apparatus 100 vibrates under the action of an external force, the first elements 122 can be elastically deformed, thereby reducing the probability that the printed circuit board 31 is broken due to the external force. In this example, the lower housing 12 is formed with or connected to accommodating portions 121 for accommodating at least parts of the first elements 122. An accommodating portion 121 is a recess, the first element 122 is partially disposed in the preceding recess, and the recess and the lower housing 12 are integrally formed. The top end of the first element 122 is slightly higher than the top end of the accommodating portion 121 so that the printed circuit board 31 is not in direct contact with the accommodating portion 121. In this example, the first element 122 is a sealant with a heat-conducting function and is used for transferring the heat on the circuit board assembly to the housing, and the thermal conductivity of the first element 122 is greater than or equal to 1 W/(m·K).

In this example, the ratio of projection areas of the first elements 122 on the first surface 311 of the printed circuit board 31 to the area of the first surface 311 is higher than or equal to 0.2 and lower than or equal to 0.8. In some examples, the ratio of projection areas of the first elements 122 on the first surface 311 of the printed circuit board 31 to the area of the first surface 311 is higher than or equal to 0.3 and lower than or equal to 0.6. In some examples, the ratio of projection areas of the first elements 122 on the first surface 311 of the printed circuit board 31 to the area of the first surface 311 is higher than or equal to 0.4 and lower than or equal to 0.5. In some examples, the ratio of projection areas of the first elements 122 on the first surface 311 of the printed circuit board 31 to the area of the first surface 311 is 0.3.

Since the charging apparatus in the present application has a relatively strong power output capability, the overall weight of the charging apparatus is relatively heavy and the heat dissipation efficiency of the charging apparatus is reduced if conventional adhesive injection is used. Therefore, the first elements in the preceding example are used so that the heat dissipation efficiency of the charging apparatus can be improved and the overall weight of the charging apparatus can be reduced.

Figure 5:
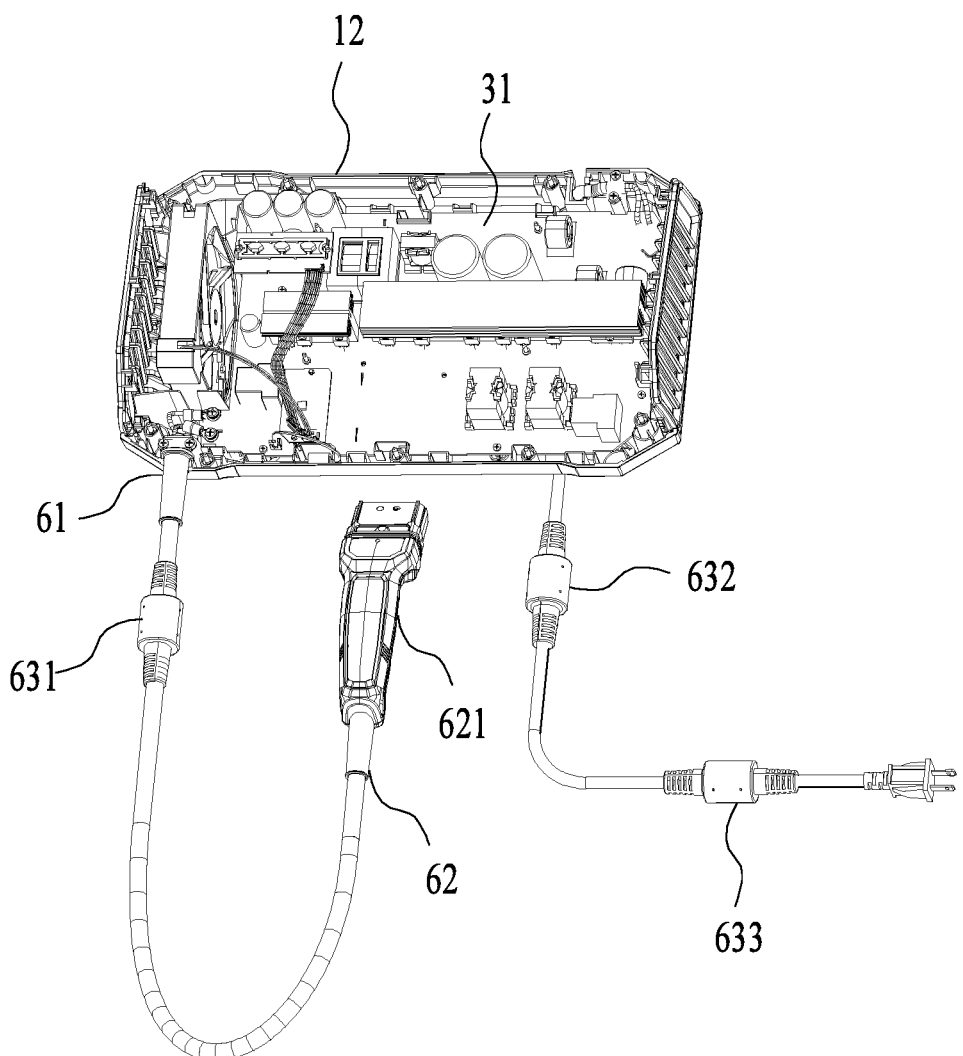
FIG. 5 is a perspective view of the charging apparatus in FIG. 1 with an upper housing removed.
Figure 6:
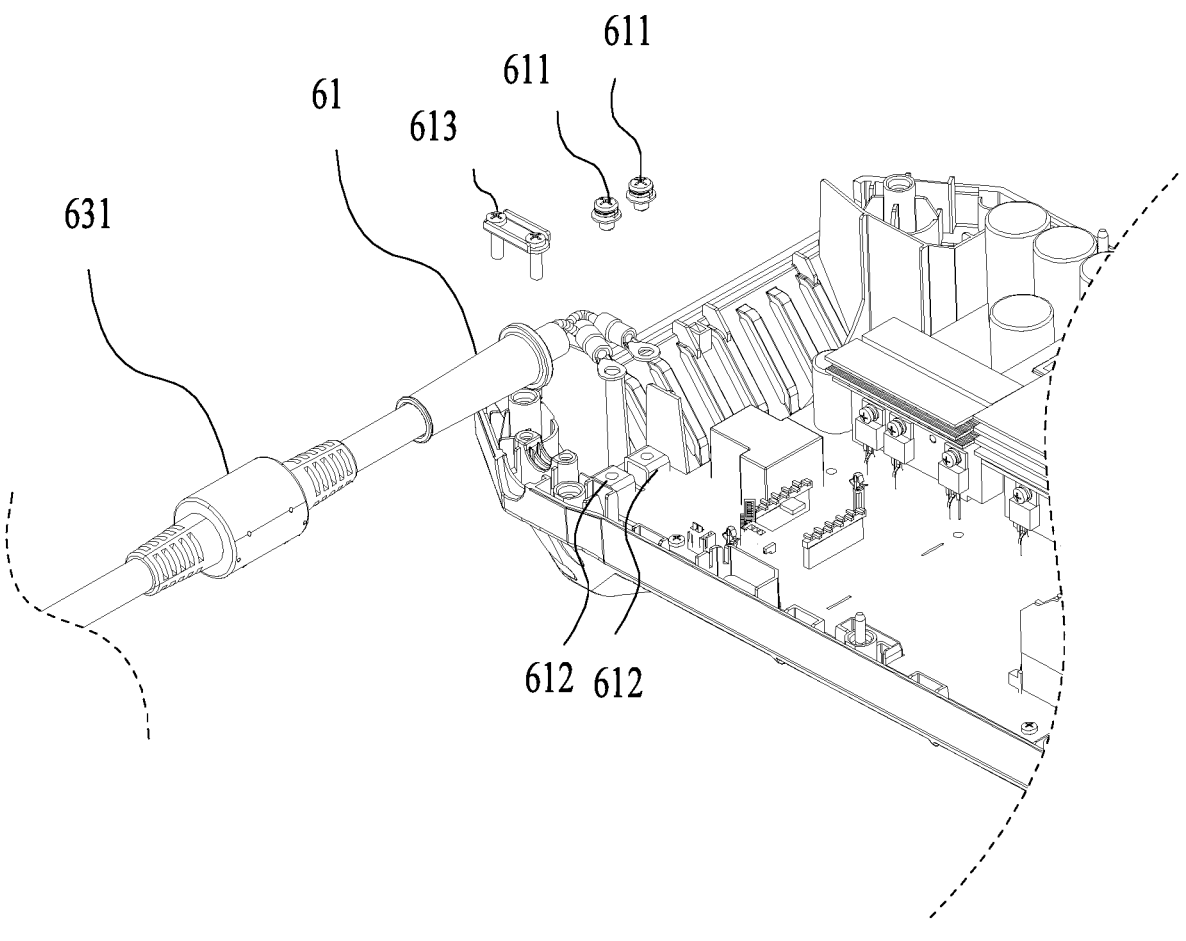
FIG. 6 is an exploded view of an output power cord, a printed circuit board, and first fasteners.

In some examples, the charging apparatus 100 may be used for charging a variety of power tools such as the riding lawn mowers or riding snow throwers. Referring to FIGS. 1, 5, and 6, the charging apparatus 100 further includes an input power cord 50 for receiving an external alternating current power supply such as mains and an output power cord 60 for outputting electrical energy to charge the power tools. The output power cord 60 is at least partially disposed in the accommodating space 101 formed by the housing 10. Specifically, the output power cord 60 has a first end 61 and a second end 62. The housing 10 is formed with a first through hole (not shown in the figure), where the first end 61 of the output power cord 60 passes through the preceding first through hole to be electrically connected to the printed circuit board 31. The second end 62 of the output power cord 60 is connected to a charging interface 621 for an electrical connection to the charging input interface of the power tool. In some examples, the charging interface 621 is electrically connected to the power tool in the form of a charging gun. In this example, the output power of the charging apparatus 100 is greater than or equal to 500 W and less than or equal to 2000 W. In some examples, the output power of the charging apparatus 100 is greater than or equal to 800 W and less than or equal to 1600 W. In some examples, the output power of the charging apparatus 100 is greater than or equal to 1000 W and less than or equal to 1400 W. In some examples, the maximum output power of the charging apparatus 100 is greater than or equal to 1200 W and less than or equal to 2000 W. The wire diameter of the output power cord 60 is greater than or equal to 20 AWG and less than or equal to 10 AWG. The length of the portion of the output power cord 60 disposed outside the housing 10 is greater than or equal to 1 m and less than or equal to 5 m.

To facilitate the operation of the charging interface 621 by a user to charge the power tool, a designer increases the length of the output power cord 60 during design, thereby satisfying charging requirements of different distances. When the user charges the power tool using the charging interface 621 or forgets to store the output power cord 60 after the charging ends, the output power cord is damaged because the user stamps on it. In summary, since the charging interface 621 is frequently operated by the user, the cable of the power cord is easily damaged and the contact of the power cord with the printed circuit board 31 is poor. When the user needs to replace the damaged power cord, a lot of time is consumed and even the printed circuit board is damaged.

The output power cord 60 in this example is detachable and easy to mount. Referring to FIG. 6, the first end 61 of the output power cord 60 is connected to the printed circuit board 31 by detachable first fasteners 611 so that a charging interface 621 is electrically connected to the printed circuit board 31. A positive wire and a negative wire extend out of the output power cord 60, and one end of a wire is connected to a gasket having a conductive function. Mounting portions 612 for electrical and fixed connections to the first fasteners 611 are connected to the printed circuit board 31. In this example, a first fastener 611 is a screw. Of course, the first fastener 611 may be a connector. A first portion of the connector is electrically connected to the first end 61 of the output power cord 60, and a second portion of the connector is electrically connected to the printed circuit board 31. The first portion of the connector and the second portion of the connector are connected to each other through plugging. The connector in this example has a waterproof function. It is to be understood that the preceding only illustrates an example in which the output power cord 60 is detachably and electrically connected to the printed power board 31, which should not be construed as the only manner.

The screw is used for fastening or the connector is used for the connection so that the output power cord 60 and the printed circuit board 31 are electrically connected to each other, and the later maintenance can be facilitated, thereby reducing the maintenance costs.

In this example, the charging apparatus 100 further includes a second fastener 613 for fixing the output power cord 60 to the lower housing 12, thereby avoiding a poor contact between the output power cord 60 and the printed circuit board 31 caused when the user drags the output power cord 60. In this example, the second fastener 613 is fastened to the lower housing 12 by screws.

In some examples, the charging apparatus 100 further includes multiple magnetic rings sleeved on the input power cord 50 and the output power cord 60 and used for improving the interference-proof capability to high-frequency signals. Referring to FIG. 5, a first magnetic ring 631 is sleeved on the output power cord 60, and a second magnetic ring 632 and a third magnetic ring 633 are sleeved on the input power cord 50. In this example, the distance from the first magnetic ring 631 to the first end 61 of the output power cord 60 on an extension path of the output power cord 60 is less than or equal to 1 m.

When the charging apparatus 100 charges the battery pack in the power tool, a charge current outputted by the charging apparatus 100 is greater than or equal to 15 A and less than or equal to 30 A. It is to be understood that when the charging apparatus 100 is in a working state, the circuit board assembly 30 generates much heat. If the heat in the charging apparatus 100 cannot be dissipated in time, the working efficiency of the charging apparatus 100 may be reduced or even a safety hazard may be caused. In this example, the heat generated by the heat-generating elements 32 during the working of the charging apparatus 100 is greater than 0.1 kWh. In some examples, a fan is obliquely disposed so that more air is blown to the circuit board assembly 30 so that the heat dissipation effect of the charging apparatus 100 is improved and the height of the charging apparatus in the up and down direction can be reduced, thereby making the charging apparatus more compact.

Figure 7:
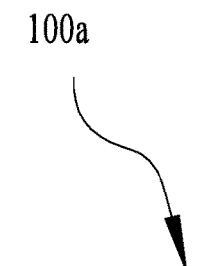
FIG. 7 is a sectional view of another charging apparatus as an example.
Figure 7:
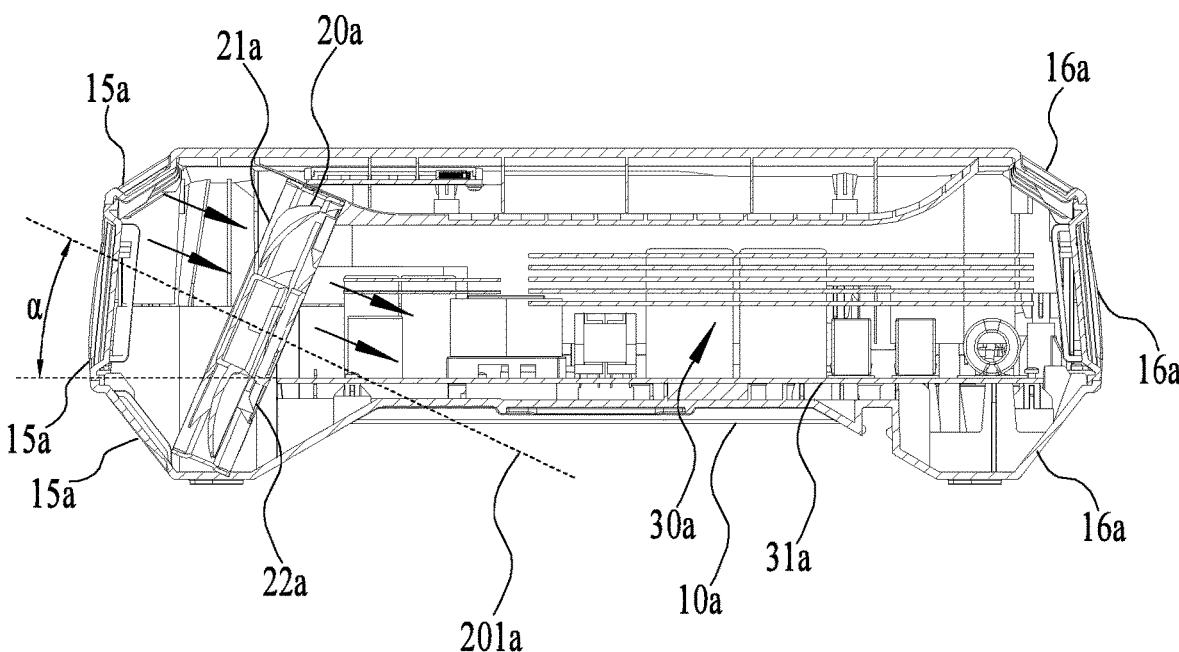
Figure 8:
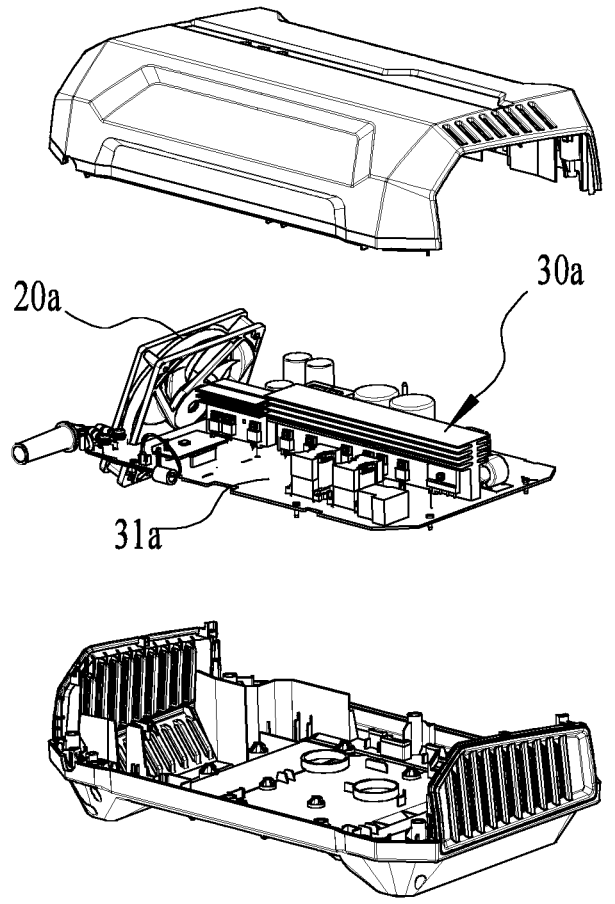
FIG. 8 is an exploded view of the charging apparatus in FIG. 7.

Referring to FIGS. 7 and 8, a charging apparatus 100a includes a fan 20a for generating a cooling airflow to dissipate heat in the interior space of the charging apparatus 100a. The fan 20a is disposed at an end which is in a housing 10a and faces away from air outlets 16a. The fan 20a has a fan air inlet 21a facing air inlets 15a and a fan air outlet 22a facing away from the air inlets 15a. When the charging apparatus 100a begins working, the fan 20a starts, air outside the housing 10a generates the cooling airflow under the action of the fan 20a, and the direction of the cooling airflow is shown by arrows in FIG. 7. After entering the housing 10a from the air inlets 15a, the cooling airflow flows through the fan air inlet 21a, the fan 20a, and the fan air outlet 22a, then passes through a circuit board assembly 30a, and finally flows out from the air outlets 16a so that heat in the housing 10a is carried away and the heat of the charging apparatus 100a is dissipated. In some examples, the flow direction of the cooling airflow flowing out from the fan air outlet 22a is configured to be oblique with respect to a printed circuit board 31a.

In some examples, the fan 20a includes an outer fan frame arranged along the radial direction of the fan 20a and used for fixedly mounting the fan 20a to the housing 10a. A vibration damping material such as rubber or foam is wrapped on the outer side of the outer fan frame. When the fan 20a rapidly rotates, in particular, when the airflow impinges on the fan 20a rapidly, the vibration damping material can reduce the vibration of the fan 20a to a certain extent, thereby reducing noise. Blades of the fan 20a rotate about a rotation axis 201a. The rotation axis 201a is configured to be oblique with respect to the printed circuit board 31a. In some examples, the included angle α between the rotation axis 201a and the printed circuit board 31a is greater than 0° and less than or equal to 45°. The included angle α between the rotation axis 201a and the printed circuit board 31a is greater than or equal to 15° and less than or equal to 30°. In some examples, the included angle α between the rotation axis 201a and the printed circuit board 31a is 20°.

Figure 9:
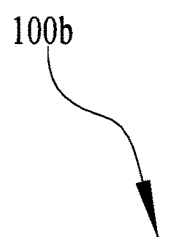
FIG. 9 is a partial sectional view of another charging apparatus as an example.
Figure 9:
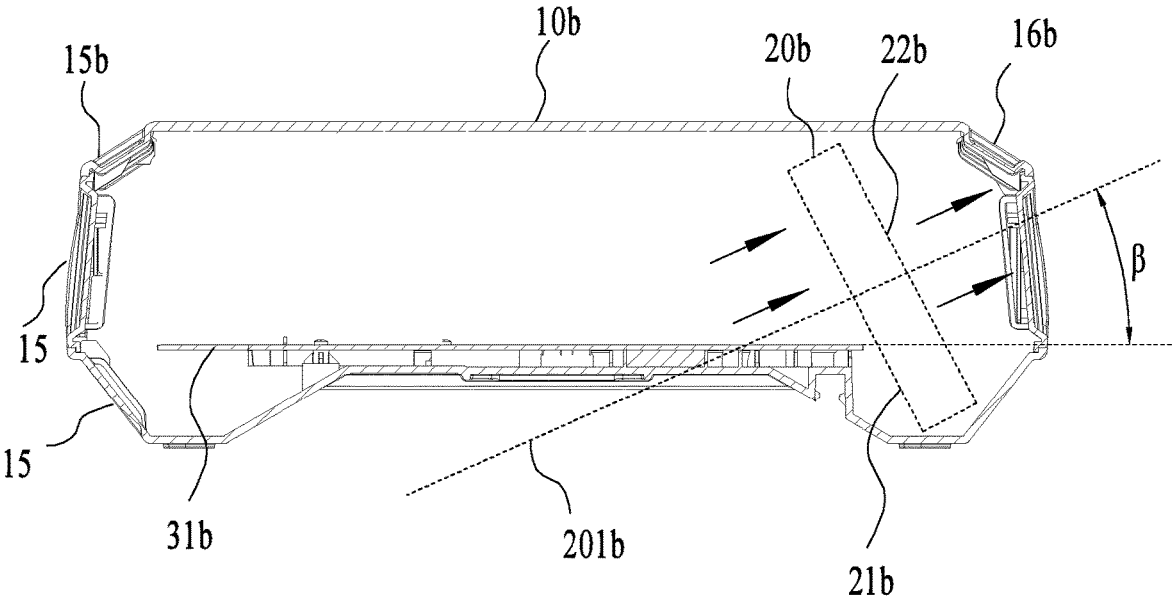

In some examples, the fan can be disposed at the air outlet side of the charging apparatus. Referring to FIG. 9, a charging apparatus 100b includes a fan 20b disposed at an end which is in a housing 10b and faces away from an air inlet 15b. The fan 20b has a fan air inlet 21b facing the air inlet 15b and a fan air outlet 22b facing away from the air inlet 15b. When the charging apparatus 100b begins working, the fan 20b starts, air outside the housing 10b generates the cooling airflow under the action of the fan 20b, and the direction of the cooling airflow is shown by arrows in FIG. 9. After entering the housing 10b from the air inlet 15b, the cooling airflow flows through a printed circuit board 31b, the fan air inlet 21b, the fan 20b, and the fan air outlet 22b and finally flows out from an air outlet 16b so that heat in the housing 10b is carried away and heat of the charging apparatus 100b is dissipated. In this example, blades of the fan 20b rotate about a rotation axis 201b. The rotation axis 201b is configured to be oblique with respect to the printed circuit board 31b.

In some examples, the included angle between the rotation axis 201b and the printed circuit board 31b is greater than 0° and less than or equal to 45°. The included angle β between the rotation axis 201b and the printed circuit board 31b is greater than or equal to 15° and less than or equal to 30°. In some examples, the included angle between the rotation axis 201b and the printed circuit board 31b is 20°.

Two examples are described above in which the fans are arranged obliquely with respect to the printed circuit boards. When the charging apparatuses work and the fans run, the cooling airflows generated by the fans are arranged obliquely with respect to the printed circuit boards. Thus, on the one hand, the amount of air flowing through the printed circuit boards can be increased, thereby improving heat dissipation effects. On the other hand, the fans are disposed obliquely so that the heights of the fans in the up and down direction are reduced, thereby reducing the heights of the charging apparatuses. Thus, the charging apparatuses have more compact structures and smaller volumes.

Figure 10:
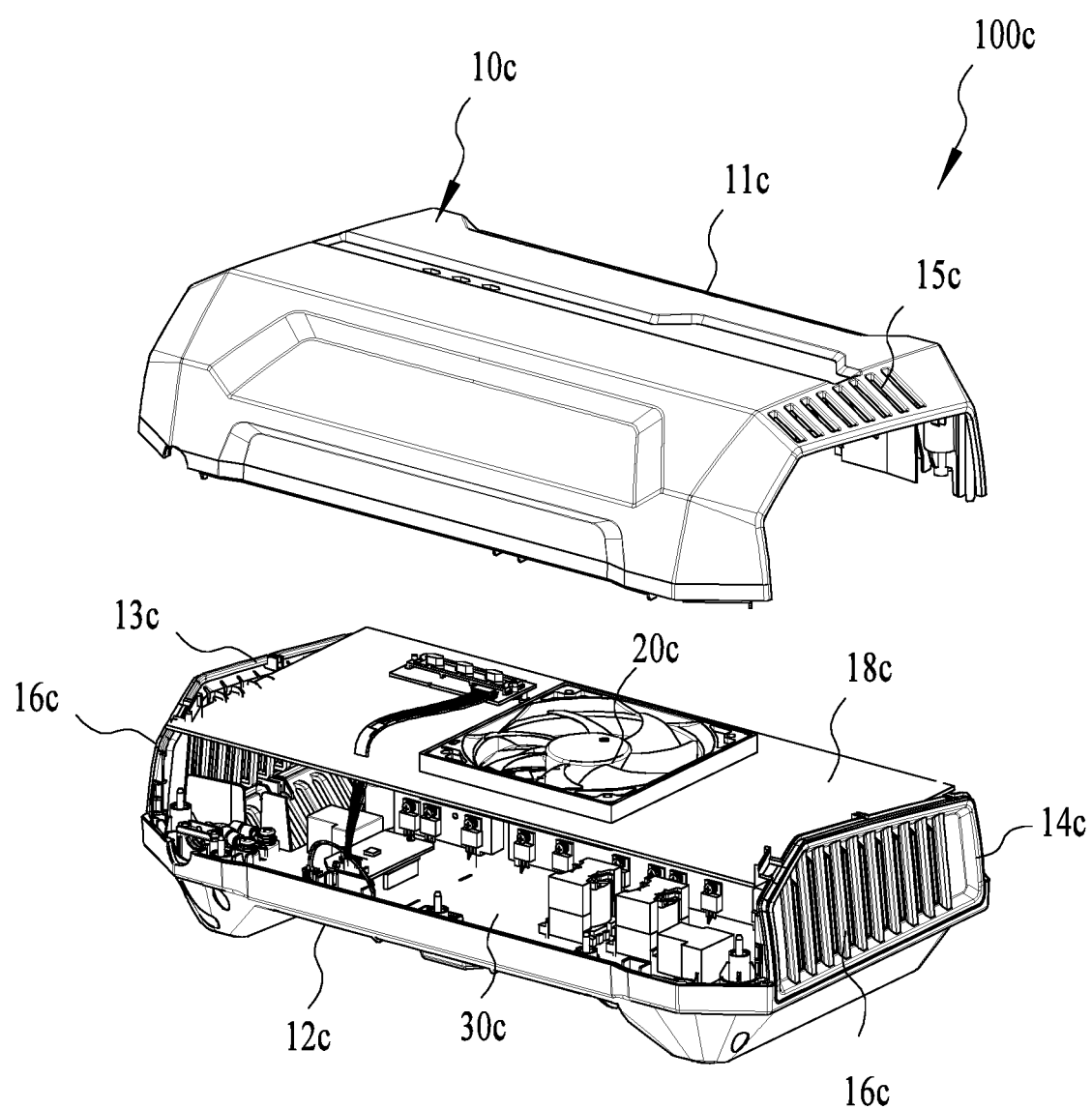
FIG. 10 is a partial exploded view of another charging apparatus as an example.
Figure 11:
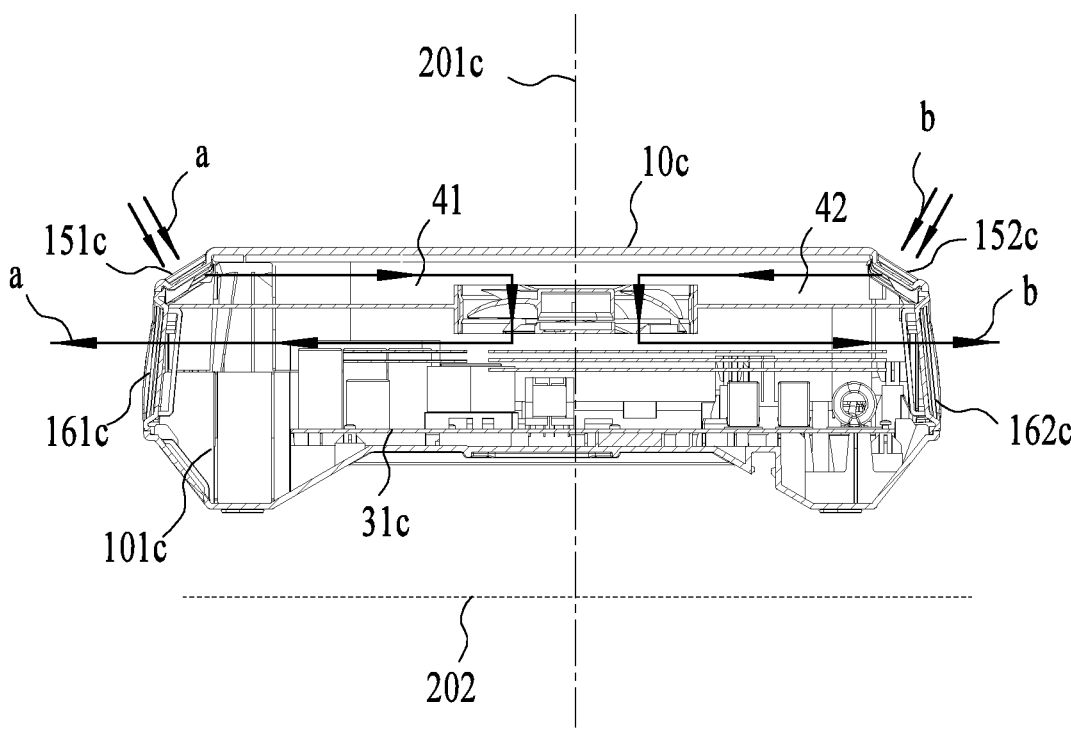
FIG. 11 is a schematic view showing the flow direction of a cooling airflow of the charging apparatus in FIG. 10.

In some examples, the fan may be arranged in another manner. Referring to FIGS. 10 and 11, a fan 20c is disposed at the upper end of a charging apparatus 100c, thereby shortening the length of the charging apparatus 100c in the left and right direction. Specifically, the charging apparatus 100c includes a housing 10c assembled from an upper housing 11c, a lower housing 12c, a left housing 13c, and a right housing 14c. The housing 10c is formed with an accommodating space 101c, and the fan 20c for generating the cooling airflow and a circuit board assembly 30c for implementing the charging function of the charging apparatus 100c are arranged in the accommodating space 101c. The fan 20c is used for generating the cooling airflow so as to carry away heat generated in the charging apparatus 100c. The circuit board assembly 30c includes the printed circuit board 31c and multiple electronic elements disposed on the printed circuit board 31c. The printed circuit board 31 is disposed in the lower housing 12.

In this example, the charging apparatus 100c further includes a deflector 18c fixedly mounted to the housing 10c. The deflector 18c is generally sheet-shaped and substantially parallel to the printed circuit board 31c. Amounting portion (not shown in the figure) for mounting the fan 20c is formed in the middle region of the deflector 18c. In this example, the fan 20c may be an axial fan or a centrifugal fan, which is not limited in the present application. Of course, in some examples, the fan 20c may be fixedly mounted to the housing 10c such as the upper housing 11c. In some examples, the fan 20c may be mounted to the deflector 18c and the upper housing 11c at the same time.

Specifically, the fan 20c rotates about a rotation axis 201c substantially perpendicular to the printed circuit board 31c. Within a first plane 202 perpendicular to the rotation axis 201c, a projection of the fan 201c on the first plane 202 is within a projection of the printed circuit board 31c on the first plane 202, which may be understood as that the fan 20c is disposed entirely above the printed circuit board 31c.

The housing 10c is formed with at least first air vents 15c and second air vents 16c. The first air vents 15c and the second air vents 16c are disposed on two sides of the deflector 18 in the up and down direction. When the fan 20c rotates about the rotation axis 201c, the cooling airflow flowing through the first air vents 15c and the second air vents 16c can be generated. The housing 10c and the deflector 18c are formed with at least a first channel 41 and a second channel 42 for the preceding cooling airflow to flow through. The cooling airflow flows through at least the circuit board assembly 30c, thereby carrying away heat generated by heat-generating elements on the printed circuit board 31c.

In some examples, a first air vent 15c serves as an air inlet, and a second air vent 16c serves as an air outlet. Specifically, the first air vent 15c includes a first air inlet 151c and a second air inlet 152c. The second air vent 16c includes a first air outlet 161c and a second air outlet 162c. The first air inlet 151c and the second air inlet 152c are disposed on two sides of the fan 20c in the left and right direction. The first air outlet 161c and the second air outlet 162c are disposed on the two sides of the fan 20c in the left and right direction. In some examples, the first air inlet 151c and the second air inlet 152c are disposed on the upper housing 11c, and a first cooling airflow entering the housing 10c from the first air inlet 151c and flowing out of the housing 10c from the first air outlet 161c flows through the first channel 41, the fan 20c, and the circuit board assembly 30c sequentially. A second cooling airflow entering the housing 10c from the second air inlet 152c and flowing out of the housing 10c from the second air outlet 162c flows through the second channel 42, the fan 20c, and the circuit board assembly 30c sequentially. The flow direction of the first cooling airflow is shown by arrows a in FIG. 11, and the flow direction of the second cooling airflow is shown by arrows b in FIG. 11.

Figure 12:
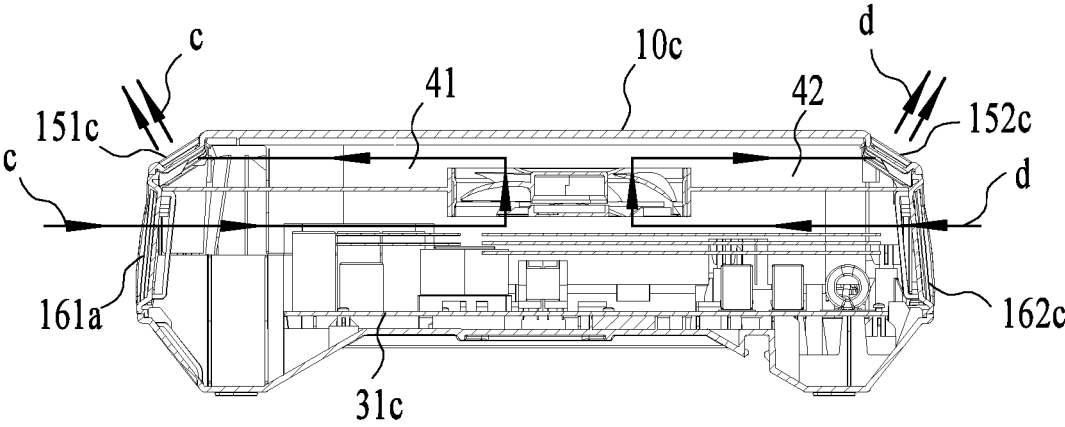
FIG. 12 is a schematic view showing another flow direction of a cooling airflow of the charging apparatus in FIG. 10.

In some examples, the first air vent 15c serves as the air outlet, and the second air vent 16c serves as the air inlet. Specifically, as shown in FIG. 12, the first air vent 15c includes a first air outlet 151c and a second air outlet 152c. The second air inlet 16c includes a first air inlet 161c and a second air inlet 162c. The first air outlet 151c and the second air outlet 152c are disposed on the two sides of the fan 20c in the left and right direction. The first air inlet 161c and the second air inlet 162c are disposed on the two sides of the fan 20c in the left and right direction. In some examples, the first air inlet 161c and the second air inlet 162c are disposed on the left housing 13c and the right housing 14c, respectively. The first air outlet 151c and the second air outlet 152c are disposed on the upper housing 11c. Specifically, a third cooling airflow entering the housing 10c from the first air inlet 161c and flowing out of the housing 10c from the first air outlet 151c flows through the circuit board assembly 30c, the fan 20c, and the first channel 41 sequentially. A fourth cooling airflow entering the housing 10c from the second air inlet 162c and flowing out of the housing 10c from the second air outlet 152c flows through the circuit board assembly 30c, the fan 20c, and the second channel 42 sequentially. The flow direction of the third cooling airflow is shown by arrows c in FIG. 12, and the flow direction of the fourth cooling airflow is shown by arrows d in FIG. 12.

With the preceding technical solution, the fan 20c is disposed on the upper portion of the charging apparatus 100c so that the length of the charging apparatus 100c in the left and right direction can be shortened. Thus, the whole charging apparatus has a shorter length and a more compact structure.

In some examples, the charging apparatus 100 further includes circuitry configured to control the state of the charging apparatus 100. The charging apparatus 100 receives the external alternating current, performs voltage conversion through a voltage conversion circuit in the charging apparatus 100, and finally outputs a charge voltage or a charge current satisfying requirements to charge the power tool.

Figure 13A:
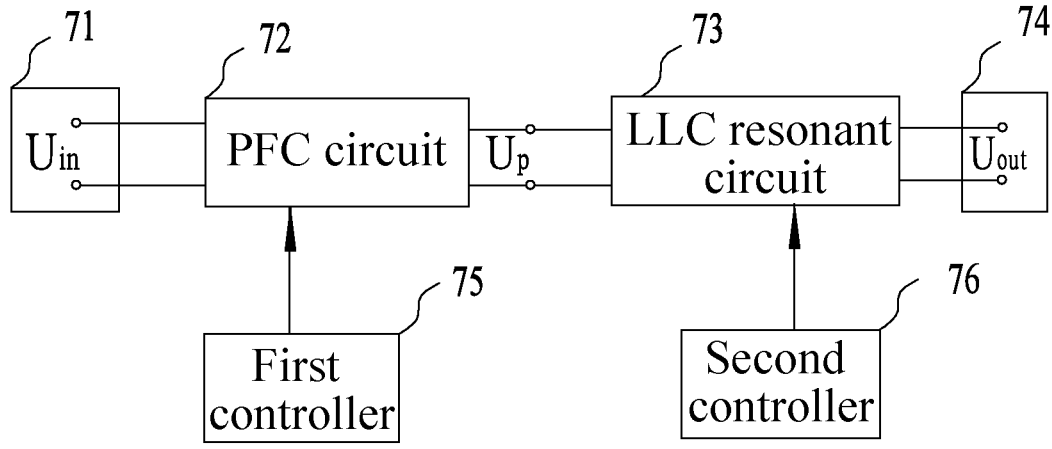
FIG. 13a is a circuit schematic of circuitry of the charging apparatus in FIG. 1.
Figure 13B:
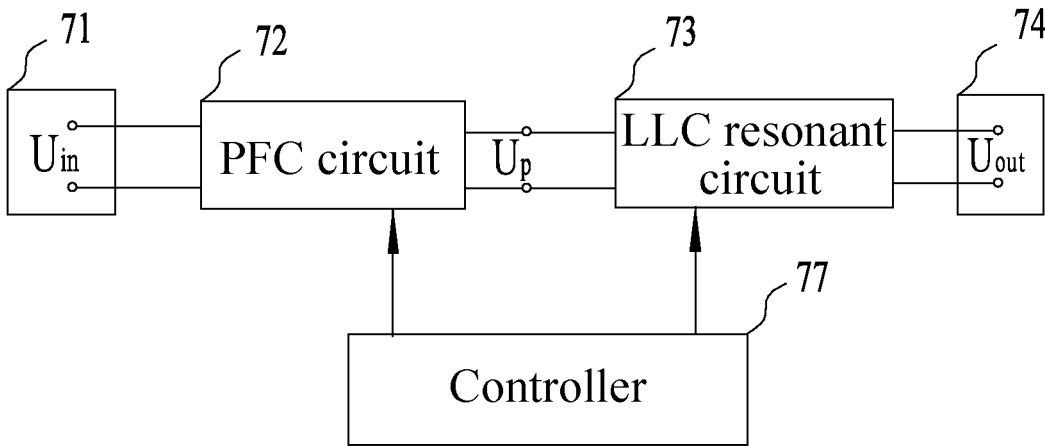
FIG. 13b is a circuit schematic of circuitry of another example of the charging apparatus in FIG. 1.

Referring to FIG. 13a, the circuitry includes an alternating current input terminal 71, a PFC circuit 72, an LLC resonant circuit 73, and a direct current output terminal 74. The alternating current input terminal 71 is configured to receive the mains or other forms of alternating currents $U_{in}$. The PFC circuit 72 is configured to convert an accessed alternating current $U_{in}$ into a first direct current $U_p$. The LLC resonant circuit 73 is configured to convert the first direct current $U_p$ into a second direct current $U_{out}$. The direct current output terminal 74 is configured to output the second direct current $U_{out}$ to charge the power tool or the battery pack mounted to the power tool. In some examples, the circuitry further includes a first controller 75 and a second controller 76. The first controller 75 is electrically connected to the PFC circuit 72 to control the state of the PFC circuit 72. The second controller 76 is electrically connected to the LLC resonant circuit 73 to control the state of the LLC resonant circuit 73. In some examples, referring to FIG. 13b, the circuitry in FIG. 13b differs from the preceding circuitry in FIG. 13a in that only one controller 77 is provided, electrically connected to the PFC circuit 72 and the LLC resonant circuit 73 at the same time, and configured to control the state of the PFC circuit 72 and the state of the LLC resonant circuit 73.

In this example, the output power of the charging apparatus 100 is greater than or equal to 500 W and less than or equal to 2000 W. In some examples, the output power of the charging apparatus 100 is greater than or equal to 800 W and less than or equal to 1600 W. In some examples, the effective voltage value of the alternating current $U_{in}$ accessed by the alternating current input terminal 71 is greater than or equal to 85 V and less than or equal to 264 V. The voltage value of the first direct current $U_p$ outputted by the PFC circuit 72 is greater than or equal to 350 V and less than or equal to 410 V. The voltage value of the second direct current $U_{out}$ outputted by the direct current output terminal 74 is greater than or equal to 21 V and less than or equal to 60 V. It is to be understood that the charging apparatus 100 in this example can convert the alternating current having the effective voltage value between 85 V and 264 V into the direct current having the voltage value between 21 V and 60 V. Specifically, the working state of the PFC circuit and the working state of the LLC resonant circuit 73 are controlled by the first controller 75 and the second controller 76. Thus, the voltage value of the second direct current $U_{out}$ outputted by the direct current output terminal 74 is controlled so that charge voltage requirements of different power tools are satisfied.

In the related art, a common PFC circuit 72 includes an interleaved PFC circuit and a bridgeless PFC circuit. In this example, a common LLC resonant circuit 73 includes a full-bridge LLC resonant circuit and a half-bridge LLC resonant circuit. The interleaved PFC circuit can obtain a relatively high power factor and reduce harmonic pollution to a power grid, thereby being widely used.

The circuit schematic and working principle of the circuitry in the present application are described below with reference to FIGS. 14 and 15. In this example, the interleaved PFC circuit is used as the PFC circuit 72, and the full-bridge LLC resonant circuit is used as the LLC resonant circuit 73.

Figure 14:
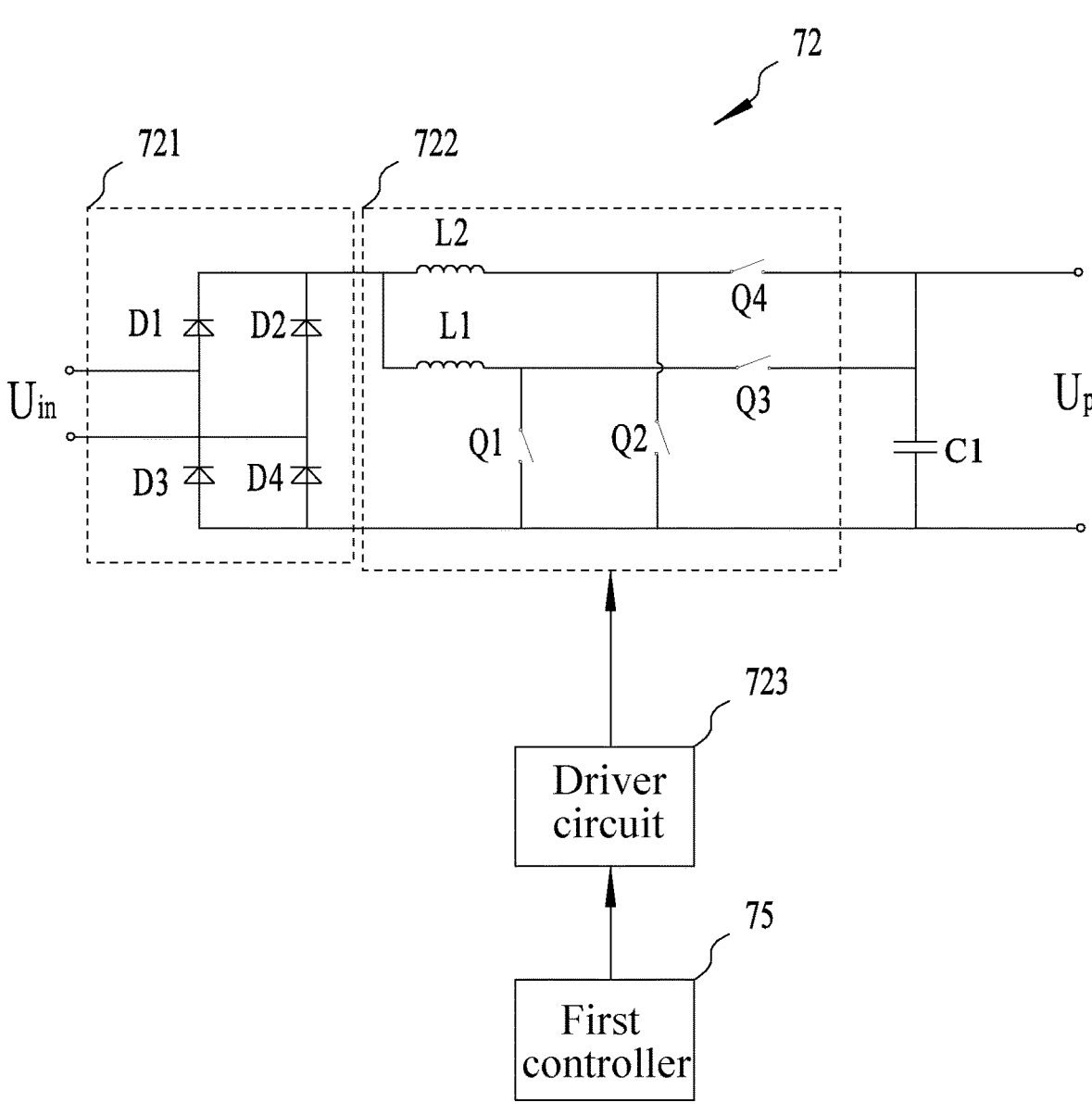

Referring to FIG. 14, the PFC circuit 72 includes a rectifier bridge 721, a step-up circuit 722, and an output filter capacitor C1. The rectifier bridge 721 is composed of four diodes D1, D2, D3, and D4 and configured to convert an inputted alternating current voltage into a direct current voltage. The input terminal of the rectifier bridge 721 receives the alternating current $U_{in}$. The step-up circuit 722 is connected to the output terminal of the rectifier bridge 721 and configured to step up the direct current voltage converted by the rectifier bridge 721. The output filter capacitor C1 is connected to the output terminal of the step-up circuit 722 and a load, and the direct current voltage stepped up by the step-up circuit 722 is applied to the output filter capacitor C1 and a stable voltage is provided for the load. Specifically, the step-up circuit is a boost circuit. The step-up circuit 722 includes two groups of step-up branches which are interleaved with each other. Each group of step-up branches include one inductor and two switch transistors, where the two switch transistors are connected in series with the inductor. A first group of step-up branches include at least an inductor L1 and a switch transistor Q1 and a switch transistor Q3 which are connected in series with the inductor L1. The second group of step-up branches include at least an inductor L2 and a switch transistor Q2 and a switch transistor Q4 which are connected in series with the inductor L2. The preceding components are connected in parallel with each other structurally such that the main circuit of the interleaved PFC circuit 72 is formed, which implements the conversion of the low voltage into the high voltage and the conversion of the alternating current into the direct current. The output filter capacitor C1 is connected to the output terminals of the two groups of step-up branches. The stability of the output voltage can be ensured by the output filter capacitor C1. The first controller 75 outputs drive signals to a driver circuit 723 to control the conducting states of the two switch transistors Q1 and Q3 and the conducting states of the two switch transistors Q2 and Q4. The switch transistors Q1 and Q3 and the switch transistors Q2 and Q4 are alternately turned on.

In this example, gallium nitride transistors are selected as the four switch transistors Q1, Q3, Q2, and Q4. Gallium nitride transistors have better breakdown capabilities, higher electron densities, higher electron mobility, and higher working temperatures than traditional silicon-based semiconductors. Since a gallium nitride transistor can withstand a higher switching frequency, the power loss of the interleaved PFC circuit 72 can be reduced, which is conducive to reducing the volume and weight of the charging apparatus. In this example, the frequencies of the drive signals which are outputted by the driver circuit 723 to control the two switch transistors Q1 and Q3 and the two switch transistors Q2 and Q4 to be on and off range from 56 kHz to 110 kHz. The driver circuit 723 outputs drive signals of corresponding frequencies based on control signals outputted by the first controller 75 so that the on and off states of the two switch transistors Q1 and Q3 and the on and off states of the two switch transistors Q2 and Q4 are controlled. Thus, the voltage value of the first direct current $U_p$ outputted by the interleaved PFC circuit 72 varies between 350 V and 410 V.

Figure 15:
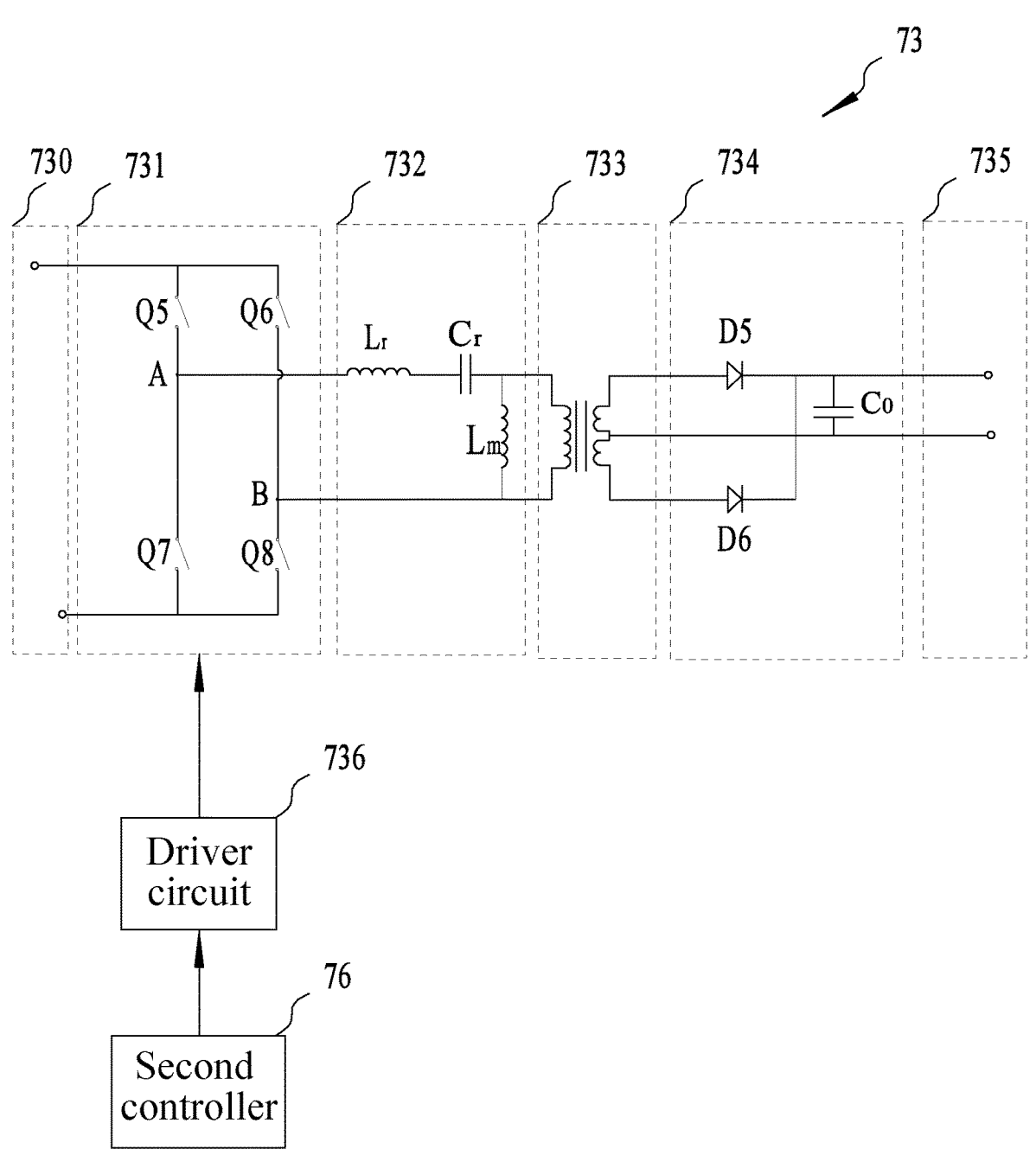

Referring to FIG. 15, the LLC resonant circuit 73 includes an input terminal 730, an inverter circuit 731, a resonant circuit 732, an isolation transformer 733, a rectifier and filter circuit 734, an output terminal 735, a driver circuit 736 electrically connected to at least the inverter circuit 731, and a second controller 76 electrically connected to the driver circuit 736. The input terminal 730 of the LLC resonant circuit 73 is electrically connected to the PFC circuit 72 and is configured to receive the first direct current $U_p$ outputted by the PFC circuit 72. The output terminal 735 of the LLC resonant circuit 73 is configured to output the second direct current $U_{out}$ to supply the charge voltage to the power tool.

Specifically, the inverter circuit 731 includes four switch transistors Q5, Q6, Q7, and Q8. The switch transistor Q5 and the switch transistor Q7 are connected in series with each other and connected to the output terminal 730, and the switch transistor Q6 and the switch transistor Q8 are connected in series with each other and connected to the output terminal 730. In this example, the four switch transistors Q5, Q6, Q7, and Q8 are transistors. In this example, gallium nitride transistors are selected as the four switch transistors Q5, Q6, Q7, and Q8.

The resonant circuit 732 includes a resonant inductor $L_r$, a resonant capacitor $C_r$, and an excitation inductor $L_m$. The resonant inductor $L_r$, the resonant capacitor $C_r$, and the excitation inductor $L_m$ are sequentially connected in series between a node A formed through the series connection of the switch transistor Q5 and the switch transistor Q7 and a node B formed through the series connection of the switch transistor Q6 and the switch transistor Q8. The excitation inductor $L_m$ is also electrically connected to two sides of the output terminal of the transformer 733. In this example, the ratio of excitation inductance $L_m$ to resonant inductance $L_r$ is higher than or equal to 3 and lower than or equal to 10. In some examples, the ratio of the excitation inductance $L_m$ to the resonant inductance $L_r$ is higher than or equal to 5 and lower than or equal to 7. In this example, the quality factor Q of the resonant circuit 732 is greater than or equal to 0.1 and less than or equal to 2. In some examples, the quality factor Q of the resonant circuit 732 is greater than or equal to 0.5 and less than or equal to 1.5. In some examples, the quality factor Q of the resonant circuit 732 is greater than or equal to 1 and less than or equal to 1.2.

The isolation transformer 733 is electrically connected to the resonant circuit 732 and is configured to transform a voltage outputted by the resonant circuit 732. In some examples, the transformation ratio N of the isolation transformer is higher than or equal to 6 and lower than or equal to 12. In some examples, the transformation ratio N of the isolation transformer is higher than or equal to 8 and lower than or equal to 10. In this example, the isolation transformer 733 is a planar transformer. Compared with a common transformer, the planar transformer is a transformer with a small volume and a very high working frequency. The planar transformer has a smaller volume and higher electrical energy conversion efficiency so that the volume of the heat dissipation member can be reduced, thereby further reducing the overall volume and weight of the charging apparatus.

The rectifier and filter circuit 734 is electrically connected to the transformer 733 and is configured to rectify and filter a voltage outputted by the transformer 733. In this example, the rectifier and filter circuit 734 includes at least a diode D5, a diode D6, and an output filter capacitor $C_0$.

In this example, the interleaved PFC circuit and the full-bridge LLC rectifier circuit are combined such that high-efficiency conversion of the alternating current into the direct current is implemented and it is ensured that the circuitry of the charging apparatus has a smaller volume. The output power of the charging apparatus in this example is greater than or equal to 500 W and less than or equal to 2000 W. In this example, the ratio of the output power of the charging apparatus to the volume of the charging apparatus is higher than or equal to 20 W/in³ and lower than or equal to 30 W/in³. In some examples, the ratio of the output power of the charging apparatus to the volume of the charging apparatus is higher than or equal to 24 W/in³ and lower than or equal to 26 W/in³.

Figure 16:
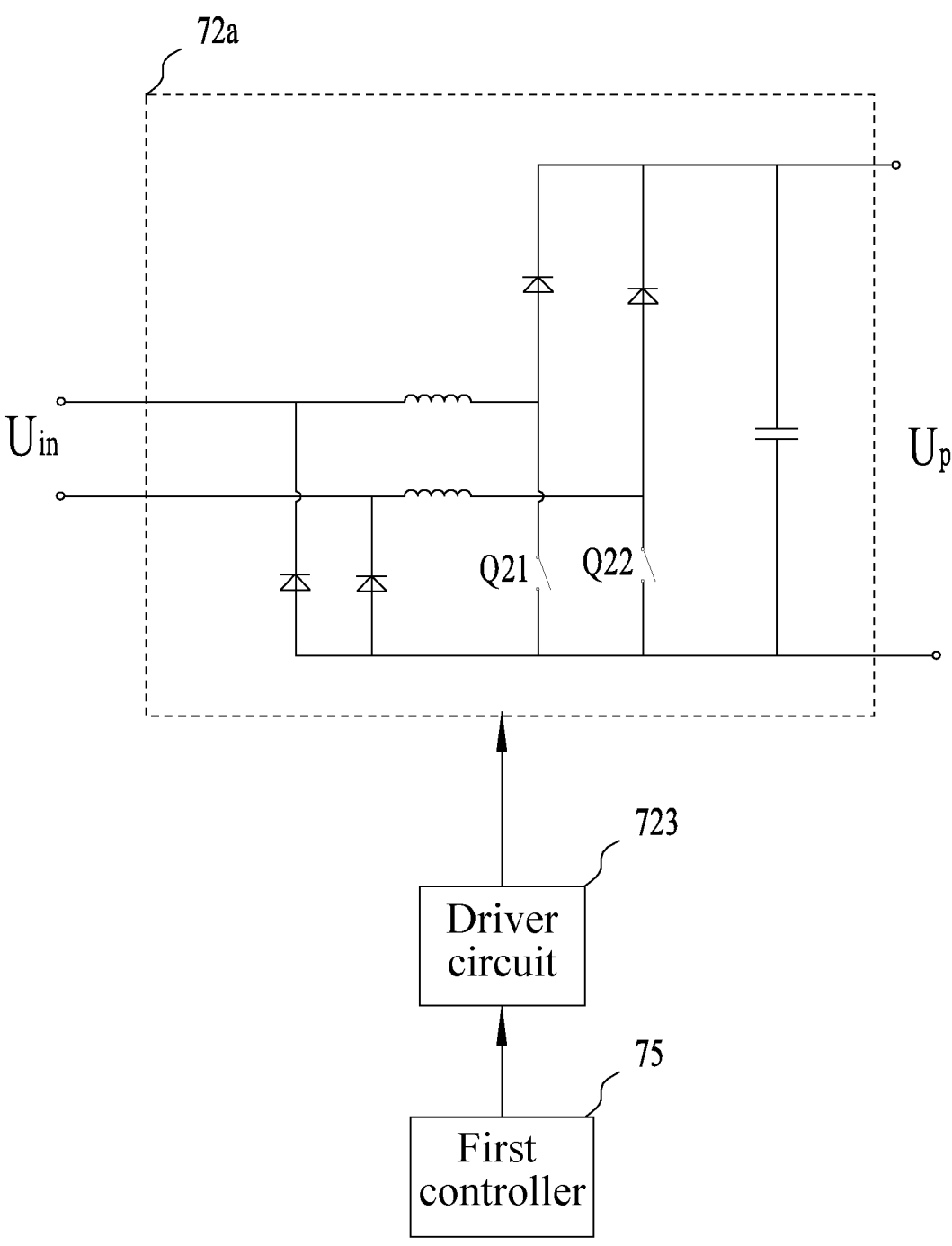

Of course, in some examples, other forms of circuits may be used as the PFC circuit to implement the function of voltage conversion. For example, the bridgeless PFC circuit is used. Referring to FIG. 16, a bridgeless PFC circuit 72a is configured to access the alternating current $U_{in}$ and convert the accessed alternating current $U_{in}$ into the first direct current $U_p$. The bridgeless PFC circuit 72a differs from the preceding interleaved PFC circuit shown in FIG. 14 in that the bridgeless PFC circuit 72a is provided with no bridge circuit and the first controller 75 outputs control signals to the driver circuit 723 to control a switch transistor Q21 and a switch transistor Q22 to be on and off. The switch transistor Q21 and the switch transistor Q22 are gallium nitride transistors. The preceding bridgeless PFC circuit is used so that a circuit structure is simpler. Thus, the complexity of the circuitry is reduced and the volume of a charging system can be reduced. FIG. 16 only exemplarily introduces one type of bridgeless PFC circuit. In fact, those skilled in the art may use other forms of bridgeless PFC circuits to implement the function of voltage conversion.

Figure 17:
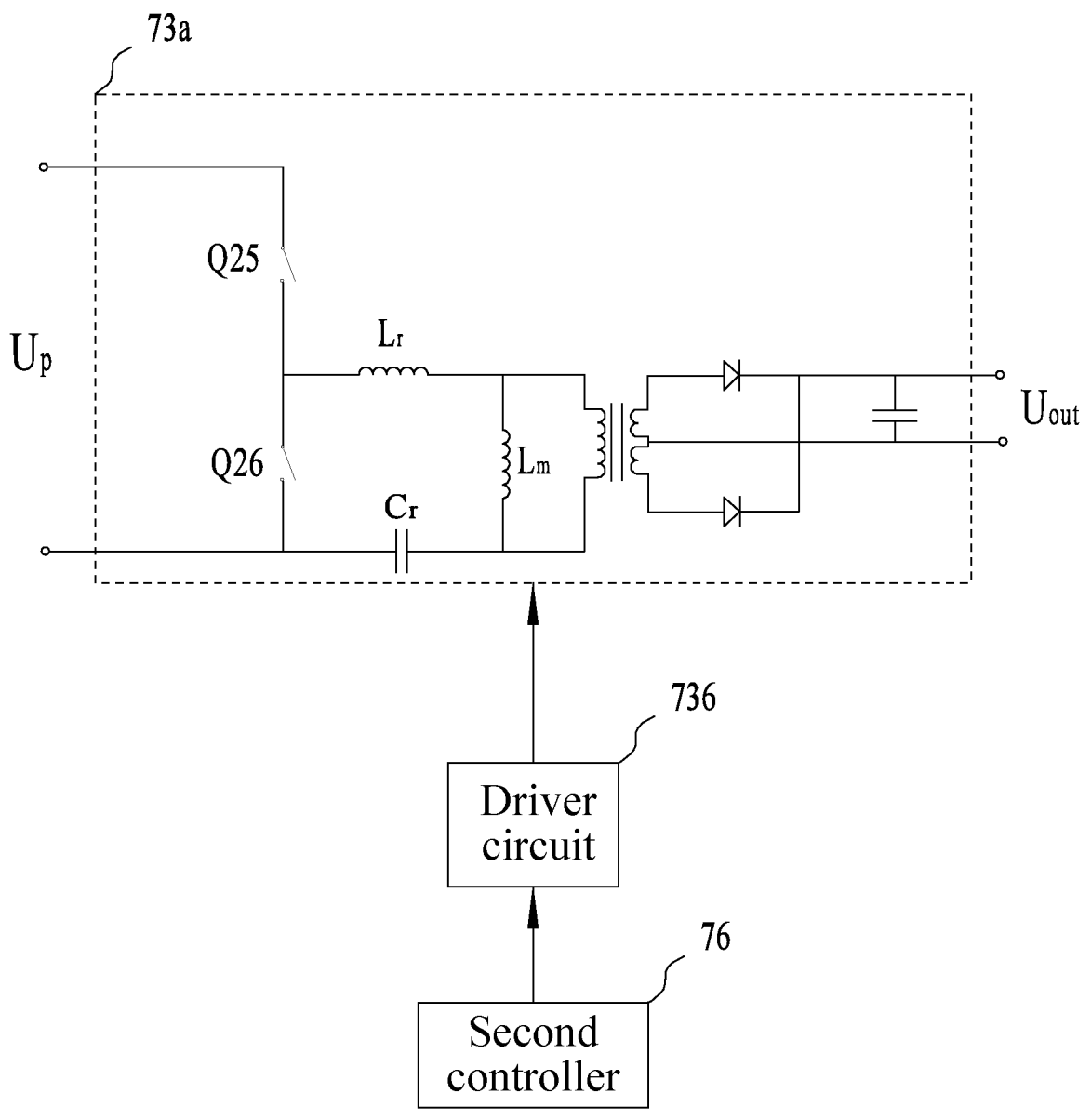

In some examples, other forms of circuits may be used as the LLC resonant circuit 73 to implement the function of voltage conversion. For example, a half-bridge LLC resonant circuit is used. Referring to FIG. 17, a half-bridge LLC resonant circuit 73a is configured to access the first direct current $U_p$ and convert the first direct current $U_p$ into the second direct current $U_{out}$ so that the second direct current $U_{out}$ is outputted to charge the power tool. The half-bridge LLC resonant circuit 73a differs from the preceding full-bridge LLC resonant circuit shown in FIG. 15 in that the half-bridge LLC resonant circuit 73a makes the circuit structure simpler. Thus, the complexity of the circuitry is reduced and the volume of the charging system can be reduced. FIG. 17 only exemplarily introduces another type of LLC resonant circuit. In fact, those skilled in the art may use other forms of LLC resonant circuits to implement the function of voltage conversion.

The basic principles, main features, and advantages of the present application are shown and described above. It is to be understood by those skilled in the art that the preceding examples do not limit the present application in any form, and all technical solutions obtained through equivalent substitutions or equivalent transformations fall within the scope of the present application.

What is claimed is:

1. A charging apparatus for charging a power tool or a battery pack adapted to the power tool, comprising:
  a housing formed with an accommodating space; and
  a circuit board assembly disposed in the accommodating space and comprising a printed circuit board provided with a plurality of electronic elements;
  wherein output power of the charging apparatus is greater than or equal to 500 W and less than or equal to 2000 W, and a ratio of the output power of the charging apparatus to a volume of the charging apparatus is higher than or equal to 20 W/in³ and lower than or equal to 30 W/in³.

2. The charging apparatus according to claim 1, wherein the ratio of the output power of the charging apparatus to the volume of the charging apparatus is higher than or equal to 25 W/in³ and lower than or equal to 30 W/in³.

3. The charging apparatus according to claim 1, further comprising a circuitry comprising a power factor correction (PFC) circuit and an LLC resonant circuit electrically connected to the PFC circuit.

4. The charging apparatus according to claim 3, wherein the PFC circuit comprises an interleaved PFC circuit.

5. The charging apparatus according to claim 3, wherein the PFC circuit comprises a bridgeless PFC circuit.

6. The charging apparatus according to claim 3, wherein the PFC circuit is configured to receive an alternating current which is externally inputted and convert the alternating current into a first direct current, and the LLC resonant circuit is configured to receive the first direct current outputted by the PFC circuit and convert the first direct current into a second direct current.

7. The charging apparatus according to claim 3, wherein the PFC circuit comprises: a rectifier bridge; a step-up circuit connected to an output terminal of the rectifier bridge and configured to step up a direct current voltage outputted by the rectifier bridge; and an output filter capacitor connected to an output terminal of the step-up circuit.

8. The charging apparatus according to claim 7, wherein the step-up circuit comprises a first group of step-up branches and a second group of step-up branches, the first group of step-up branches comprise at least an inductor L1 and a switch transistor Q1 and a switch transistor Q3 which are connected in series with the inductor L1, and the second group of step-up branches comprise at least an inductor L2 and a switch transistor Q2 and a switch transistor Q4 which are connected in series with the inductor L2.

9. The charging apparatus according to claim 8, wherein the switch transistor Q1, the switch transistor Q2, the switch transistor Q3, and the switch transistor Q4 are gallium nitride transistors.

10. The charging apparatus according to claim 9, wherein the circuitry further comprises a driver circuit driving and controlling the switch transistor Q1, the switch transistor Q2, the switch transistor Q3, and the switch transistor Q4, and frequencies of drive signals which are outputted by the driver circuit to control the switch transistor Q1, the switch transistor Q2, the switch transistor Q3, and the switch transistor Q4 to be on and off are higher than or equal to 56 kHz and lower than or equal to 110 kHz.

11. The charging apparatus according to claim 3, wherein the LLC resonant circuit comprises at least an inverter circuit, a resonant circuit, an isolation transformer, and a rectifier and filter circuit which are electrically connected in sequence.

12. The charging apparatus according to claim 11, wherein the inverter circuit comprises at least a switch transistor Q5, a switch transistor Q6, a switch transistor Q7, and a switch transistor Q8, wherein the switch transistor Q5, the switch transistor Q6, the switch transistor Q7, and the switch transistor Q8 are gallium nitride transistors.

13. The charging apparatus according to claim 11, wherein the resonant circuit comprises a resonant inductor $L_r$, a resonant capacitor $C_r$, and an excitation inductor $L_m$, wherein a ratio of excitation inductance $L_m$ to resonant inductance $L_r$ is higher than or equal to 3 and lower than or equal to 10, and a quality factor Q of the resonant circuit is greater than or equal to 0.1 and less than or equal to 2.

14. The charging apparatus according to claim 11, wherein the isolation transformer is a planar transformer, and a transformation ratio of the isolation transformer is higher than or equal to 6 and lower than or equal to 12.

15. The charging apparatus according to claim 1, wherein the output power of the charging apparatus is greater than or equal to 800 W and less than or equal to 1600 W.

16. A charging apparatus, comprising:

a housing formed with an accommodating space;

a circuit board assembly disposed in the accommodating space and comprising a printed circuit board provided with a plurality of electronic elements; and a charging gun configured to be electrically connected to a power tool;

wherein a ratio of output power of the charging apparatus to a volume of the charging apparatus is higher than or equal to 20 $W/in^3$ and lower than or equal to 30 $W/in^3$.

17. The charging apparatus according to claim 16, wherein the charging apparatus further comprises a circuitry comprising a power factor correction (PFC) circuit and an LLC resonant circuit electrically connected to the PFC circuit, the PFC circuit comprises at least an interleaved PFC circuit or a bridgeless PFC circuit, and the LLC resonant circuit comprises at least a full-bridge LLC resonant circuit or a half-bridge LLC resonant circuit.

18. The charging apparatus according to claim 17, wherein the PFC circuit comprises at least a rectifier bridge comprising at least a switch transistor, and the switch transistor is a gallium nitride transistor.

19. The charging apparatus according to claim 18, wherein the LLC resonant circuit comprises at least an isolation transformer, wherein the isolation transformer is a planar transformer, and a transformation ratio of the planar transformer is higher than or equal to 6 and lower than or equal to 12.

20. The charging apparatus according to claim 16, wherein the output power of the charging apparatus is greater than or equal to 500 W and less than or equal to 2000 W.

* * * * *